United States Patent [19]

Natsumi

[11] Patent Number: 5,745,005
[45] Date of Patent: Apr. 28, 1998

[54] DEMODULATING SYSTEM FOR CARRIER-WAVE AND SINGLE PULSE MODULATED SIGNALS

[75] Inventor: Masayuki Natsumi, Nara, Japan

[73] Assignee: Sharp Kabushiki Kaisha, Tokyo, Japan

[21] Appl. No.: 664,113

[22] Filed: Jun. 14, 1996

[30] Foreign Application Priority Data

Jul. 4, 1995 [JP] Japan ................................. 7-168924
Dec. 26, 1995 [JP] Japan ................................. 7-338525

[51] Int. Cl.$^6$ .............................. H03D 3/00; H04L 27/22
[52] U.S. Cl. ....................... 329/311; 329/304; 329/316; 375/324; 375/340; 455/142
[58] Field of Search ..................... 329/311, 313, 329/316, 317, 304; 375/239, 324, 326, 340; 455/142

[56] References Cited

U.S. PATENT DOCUMENTS 4,626,789 12/1986 Nakata et al. ........................ 329/311
5,093,844 3/1992 Gutekunst ........................... 329/313

FOREIGN PATENT DOCUMENTS 63-034 519 2/1988 Japan.

*Primary Examiner*—Siegfried H. Grimm
*Attorney, Agent, or Firm*—David G. Conlin, Esq.

[57] ABSTRACT

A communication device which is capable of automatically discriminating whether a received signal is a carrier-wave-modulated signal or a single-pulse-modulated signal and obtaining a corresponding demodulated signal, thereby reducing a burden to a user in using the device. The device comprises a demodulating circuit for demodulating a carrier-wave-modulated signal, a demodulating circuit for demodulating single-pulse-modulated signal, a switch circuit for selecting either of two demodulating circuits and a carrier detecting circuit for detecting the presence or absence of a carrier-frequency component of the carrier-wave-modulated signal, characterized that the switch circuit selects an output of the demodulating circuit for the carrier-wave-modulated signal when the carrier of the carrier-wave-modulated signal is detected by the carrier detecting circuit.

3 Claims, 10 Drawing Sheets

DEMODULATING SYSTEM FOR CARRIER-WAVE AND SINGLE PULSE MODULATED SIGNALS

BACKGROUND OF THE INVENTION

The development of compact portable type multi-functioning communication terminals was accompanied by growing user interest in further increasing communication speed. In this connection, there has been also developed a light communication method that does not need wiring between terminals and can offer a great convenience for users.

Such a serial communication method that uses light as an information carrier requires conversion of serial output transmission signals into light signals by using a suitable converting method. Today, two converting methods are used: one is to modulate a certain carrier wave in term of its presence or absence in accordance with positive or negative phase of each bit of serial data and the other is to convert each bit of serial data to a single pulse. The former is hereinafter referred as to carrier-wave-modulating method and the later is referred as to single-pulse-modulating method.

A conventional ant uses a receiving circuit common to both kinds of the above-mentioned modulation methods, which circuit converts a signal transmitted by light or other carrying medium into an electric signal by any one of the above-mentioned modulation methods. This circuit demodulates the carrier-wave-modulated signal into the serial signal by one demodulator and the single-pulse-modulated signal into the serial signal by the other demodulator.

The user inputs a setting signal according to the modulating method used for transmission. The setting signal effects a switch circuit to select an output of a designated one of two demodulating circuits, whereby the desired serial received signal according to the modulation method can be obtained.

In Japanese Laid-Open Patent Publication No. 63-34519, there is disclosed such a switching method that switches a transmission line from one to another by using a separate signal line other than the information transmission line.

In the case of communication between terminals having uncertain communication systems, users previously had to know which one of the carrier-wave-modulated signal and the single-pulse-modulated signal is transmitted prior to inputting a setting signal to the selector switch. In other words, every user was forced to perform undesired operations for recognizing the type of communication system to be used.

In case of switching-over one modulation circuit to the other after recognizing the input wave form of the communication, there may be a problem that an initial part of the received data is missing.

Furthermore, the prior art method needs two separate demodulating circuits corresponding to two kinds of the modulation systems. This leads to correspondingly increasing the size of the device circuitry and to consumption of more electric power.

SUMMARY OF THE INVENTION

The present invention relates to a communication device and, more particularly, to a communication device having a serial receiving circuit for a light medium, which device has a primary object to automatically recognize the kind of modulation of a received signal carrier-wave-modulation or single-pulse-modulation and obtain a demodulated output of the received signal, thereby reducing a burden to a user. A second object is to prevent loss of data when automatically recognizing the modulated signal, and a third object is to realize savings in size of circuitry and in required power consumption by integrating a modulating circuit.

PREFERRED EMBODIMENT OF THE INVENTION

Figure 1:
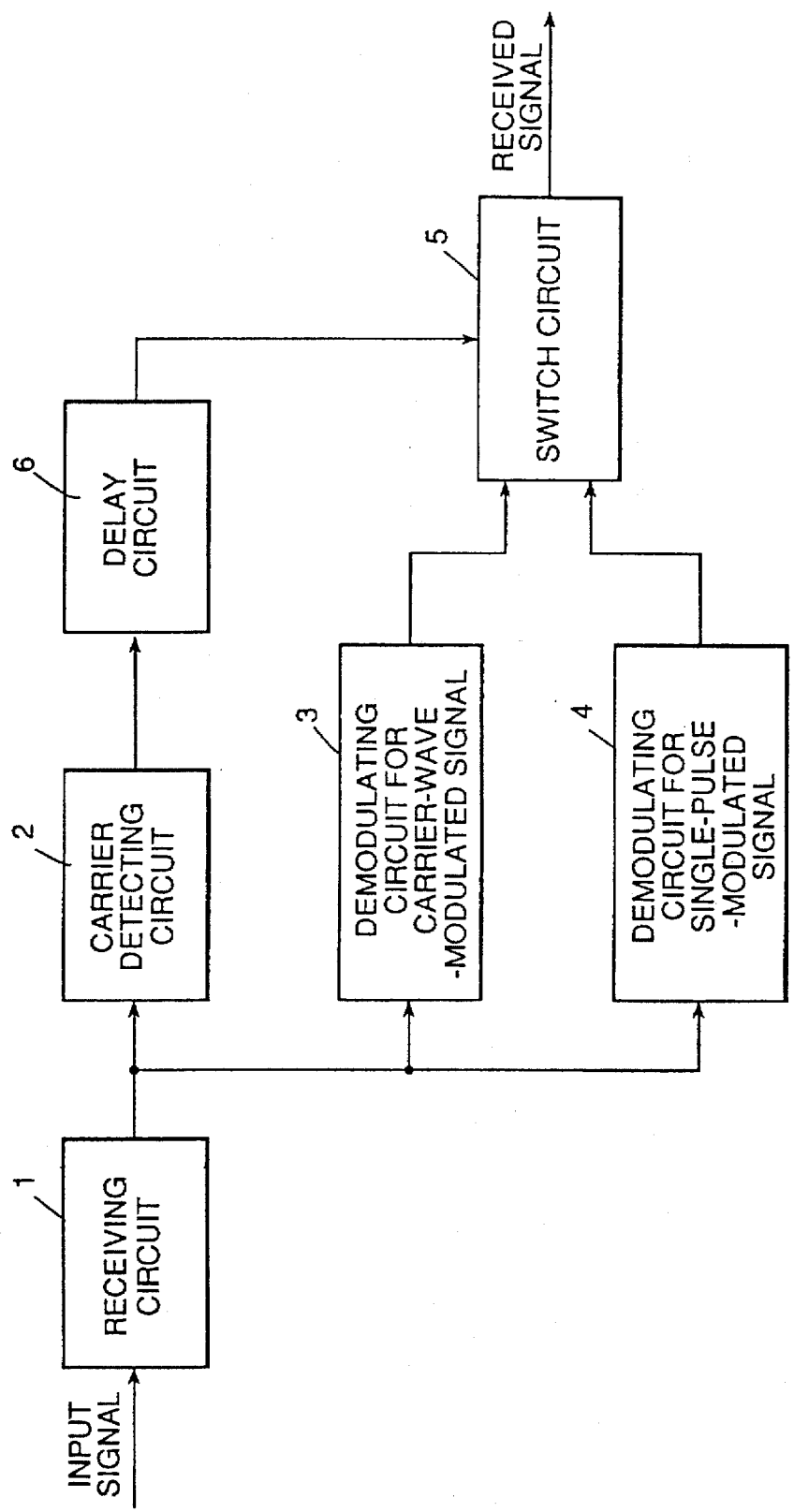
FIG. 1 is a block diagram showing a structure of a communication device that is a first embodiment of the present invention.
Figure 2:
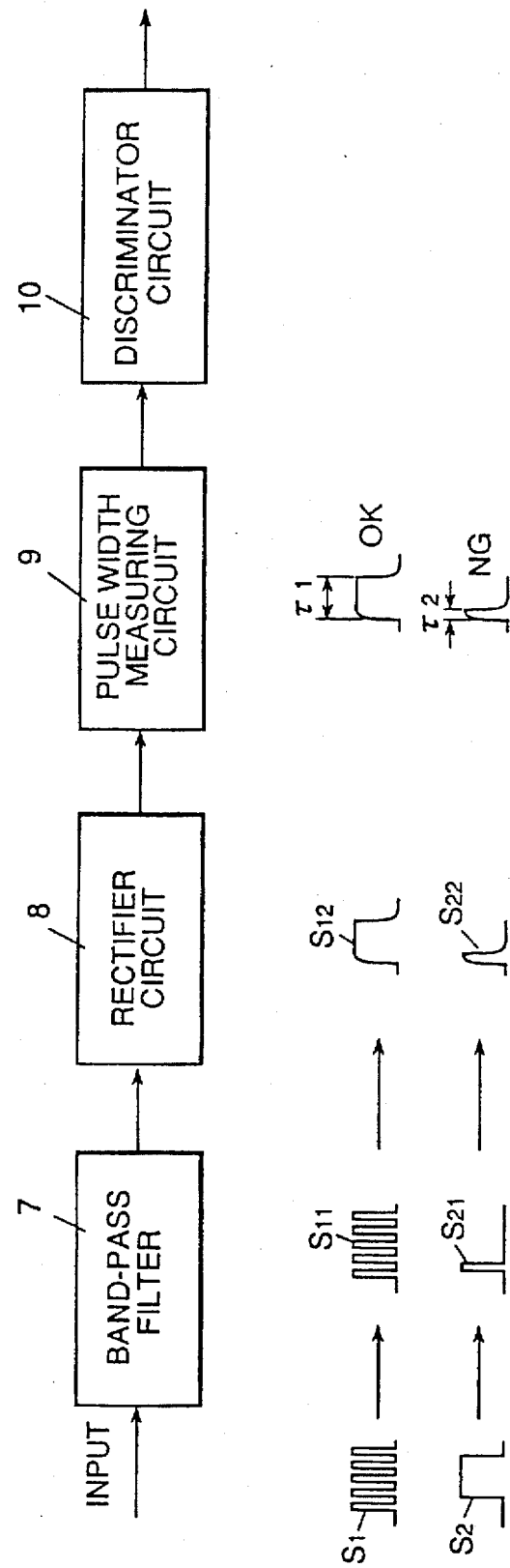
FIG. 2 is a block diagram of a carrier detecting circuit composing the communication device shown in FIG. 1.

FIG. 1 is a block diagram showing a structure of a communication device that is the first embodiment of the present invention and FIG. 2 is a block diagram of a carrier detecting circuit composing the communication device of FIG. 1.

In FIGS. 1 and 2, there is shown a receiving circuit 1 for converting a light signal transmitted by a transmission medium such as an optical fiber cable into an electric signal, a demodulating circuit 3 for demodulating a carrier-wave-modulated transmission signal to a serial received data, a demodulating circuit 4 for demodulating a single-pulse-modulated transmission signal to a serial received signal and a switch circuit 5 that selects an output of either one of the demodulating circuits 3 and 4 according to a discriminating signal of a carrier detecting circuit 2 to be described later.

Figure 3:
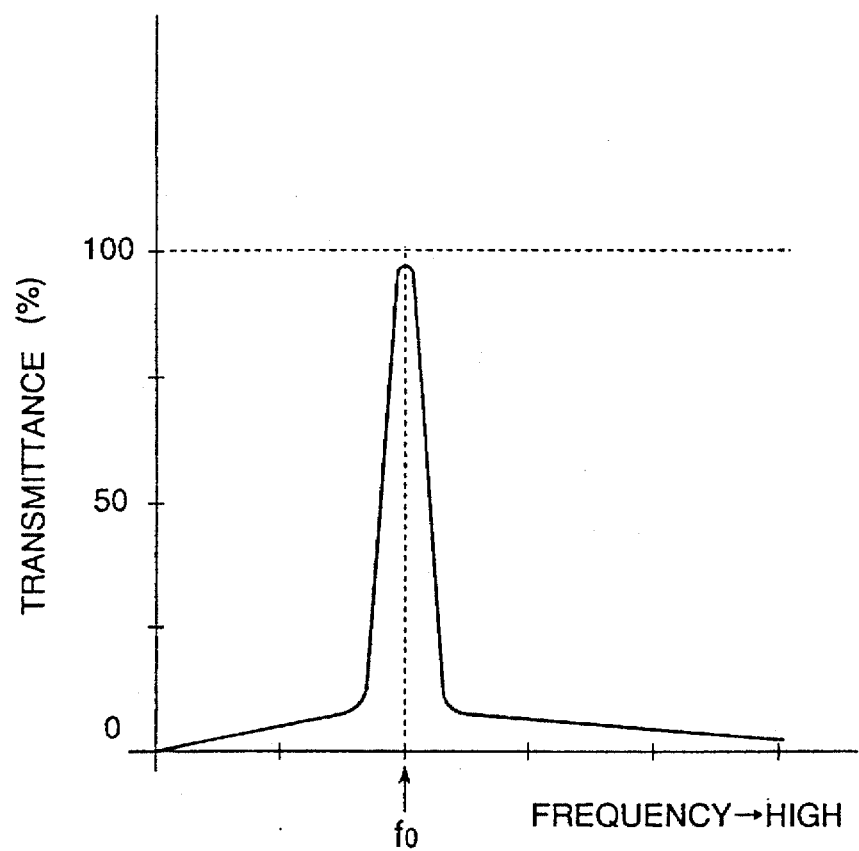
FIG. 3 shows a characteristic curve of a band-pass type filter composing the communication device shown in FIG. 1.

The first embodiment of the present invention is further provided with the carrier detecting circuit 2 and a delay circuit 6. As shown in FIG. 2, the carrier detecting circuit 2 is composed of a band-pass type filter 7 for extracting the carrier-frequency component, a rectifier circuit 8 for rectifying the carrier extracted by the filter 7 to a single waveform, a pulse width measuring circuit 9 for measuring a pulse width of the carrier wave rectified by the rectifier circuit 9 and a discriminating circuit 10 for outputting a judgment signal for discriminating which of the carrier-wave-modulated signal and the single-pulse-modulated signal is received according to the measuring result of the pulse-width measuring circuit 9. As shown in FIG. 3, the band-pass filter 7 has a filter characteristic preset to pass a carrier-frequency component ($f_o$ in FIG. 3) with the first priority.

The delay circuit 6 delays outputting a judgment signal from the discriminating circuit 10 for a preset delay time. The delay circuit 6 is provided for the following reason:

In transmission the carrier-wave-modulated signal, there may be sometimes an interruption of a receiving signal or lack of a carrier wave due to no carrier state (e.g., duration of data "0") depending upon bit structure of the receiving signal.

If a judgment signal from the carrier detecting circuit 2 were to be given directly to the switch circuit 5, the switching circuit 5 might frequently switch the connection from the demodulating circuit 3 to the demodulating circuit 4 and vice versa with the result that the receiving operation would become unstable. To avoid this, the judgment signal is not directly inputted to the switch circuit 5 and held by the delay circuit 6, i.e., the judgment signal can be stored for a period with no output of the carrier detecting circuit 2.

In the above-described communication device, the receiving circuit 1 receives a transmitted light signal and converts it into an electric signal $S_1$ or $S_2$ which is inputted into the carrier detecting circuit 2, the demodulating circuit for carrier-wave-modulated signal 3 and the demodulating circuit for single-pulse-modulated signal 4 respectively.

If the received signal $S_1$ to be input to the carrier detecting circuit 2 is of carrier-wave-modulated type, a frequency component of its carrier $S_{11}$ is extracted through the band-pass filter 7 and is then rectified to a single wave $S_{12}$ by the rectifier circuit 8. A pulse width $\tau_1$ of the wave-form $S_{12}$ may amount at least to a pulse width of one bit of a serial bit signal.

If the received signal $S_2$ to be input to the carrier detecting circuit 2 is of single-pulse-modulated type, a frequency component of its carrier $S_{21}$ is extracted through the band-pass filter 7 and is then rectified to a single wave $S_{22}$ by the rectifier circuit 8. A pulse width $\tau_2$ of the wave-form $S_{22}$ is very short and smaller than a pulse width of one bit of a serial bit signal.

The pulse-width measuring circuit 9 determines the pulse width $\tau_1$ or $\tau_2$ of rectified wave $S_{12}$ or $S_{22}$ and transfers the measurement result to the discriminator circuit 10 which in turn produces a judgment signal (high level signal) showing a carrier-wave-modulated signal if the pulse width $\tau_1$ or $\tau_2$ determined by the pulse-width measuring circuit 9 is not less than a threshold value $\tau$ corresponding to one bit pulse width of the serial signal or which produces a judgment signal (low level signal) showing a single-pulse modulated signal if the pulse width $\tau_1$ or $\tau_2$ determined by the pulse-width measuring circuit 9 is smaller than the threshold value $\tau$.

The delay circuit 6 delays these judgment signals for a specified time and then gives them to the switch circuit 5 that in turn operates to select the output of the carrier-wave-modulated signal demodulating circuit 3 if the judgment signal from the discriminator circuit 10 is a high-level signal as mentioned above or to select the output of the single-pulse-modulated signal demodulating circuit 4 if the judgment signal from the discriminator circuit 10 is a low-level signal.

With the first embodiment constructed as shown in FIG. 1, an output serial signal is automatically selected after it has been demodulated according to the corresponding demodulation system. This frees users from the operation for recognizing the signal modulation type. The provision of the delay circuit 6 may store the judgment signal for a period during which no carrier is transmitted. This makes it possible to stably continue receiving carrier-wave-modulated signals.

Figure 4:
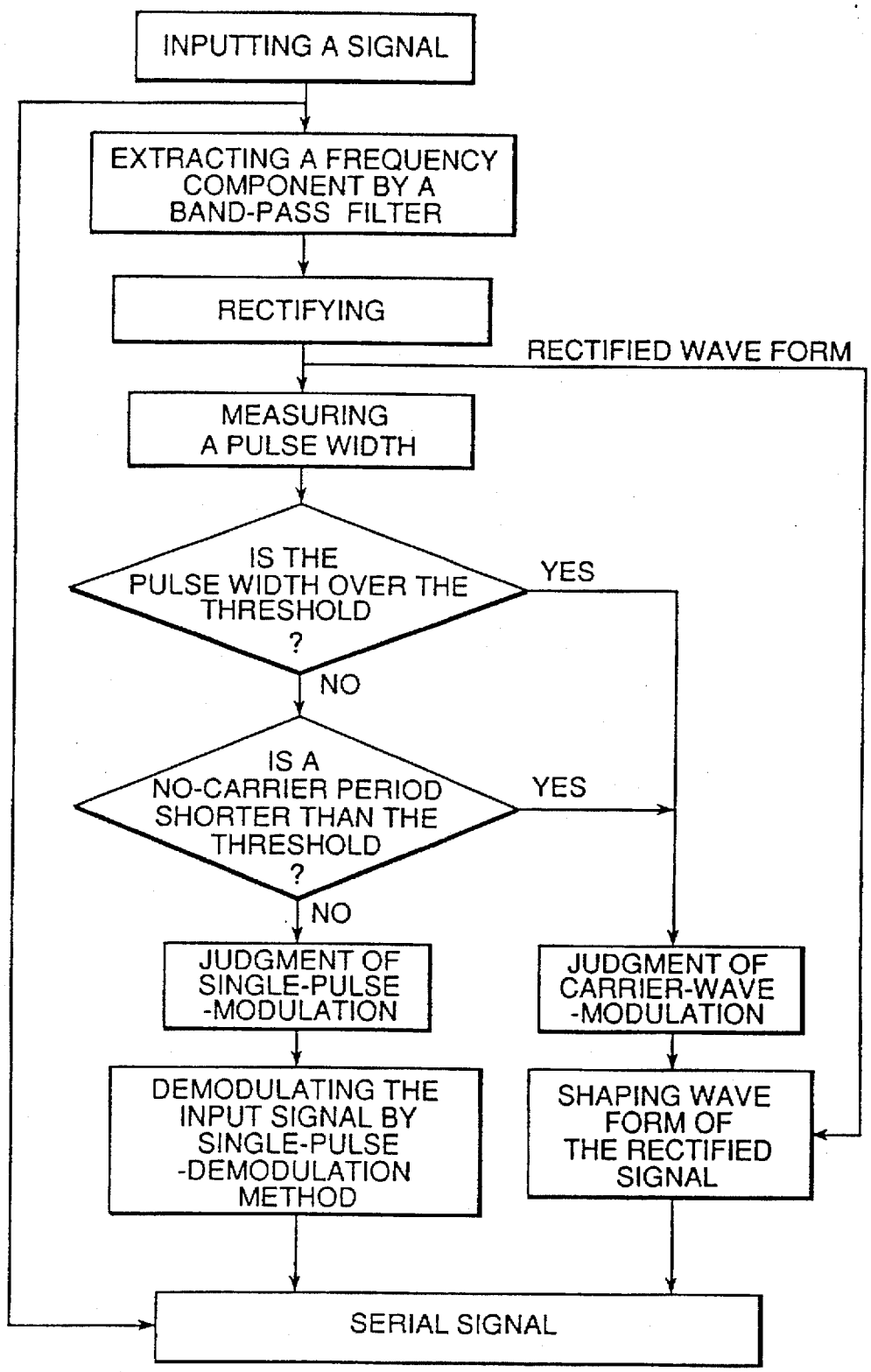
FIG. 4 is a flow chart showing a procedure of processing a received signal according to software in the first embodiment of the present invention.

Although the first embodiment is composed of the hardware shown in FIG. 1, it may also be realized by using software under control of the central processing unit according to a flow chart shown in FIG. 4. The detailed description of the flow chart of FIG. 4 is omitted since its procedure is the same as described for the circuits of the embodiment shown in FIG. 1.

Figure 5:
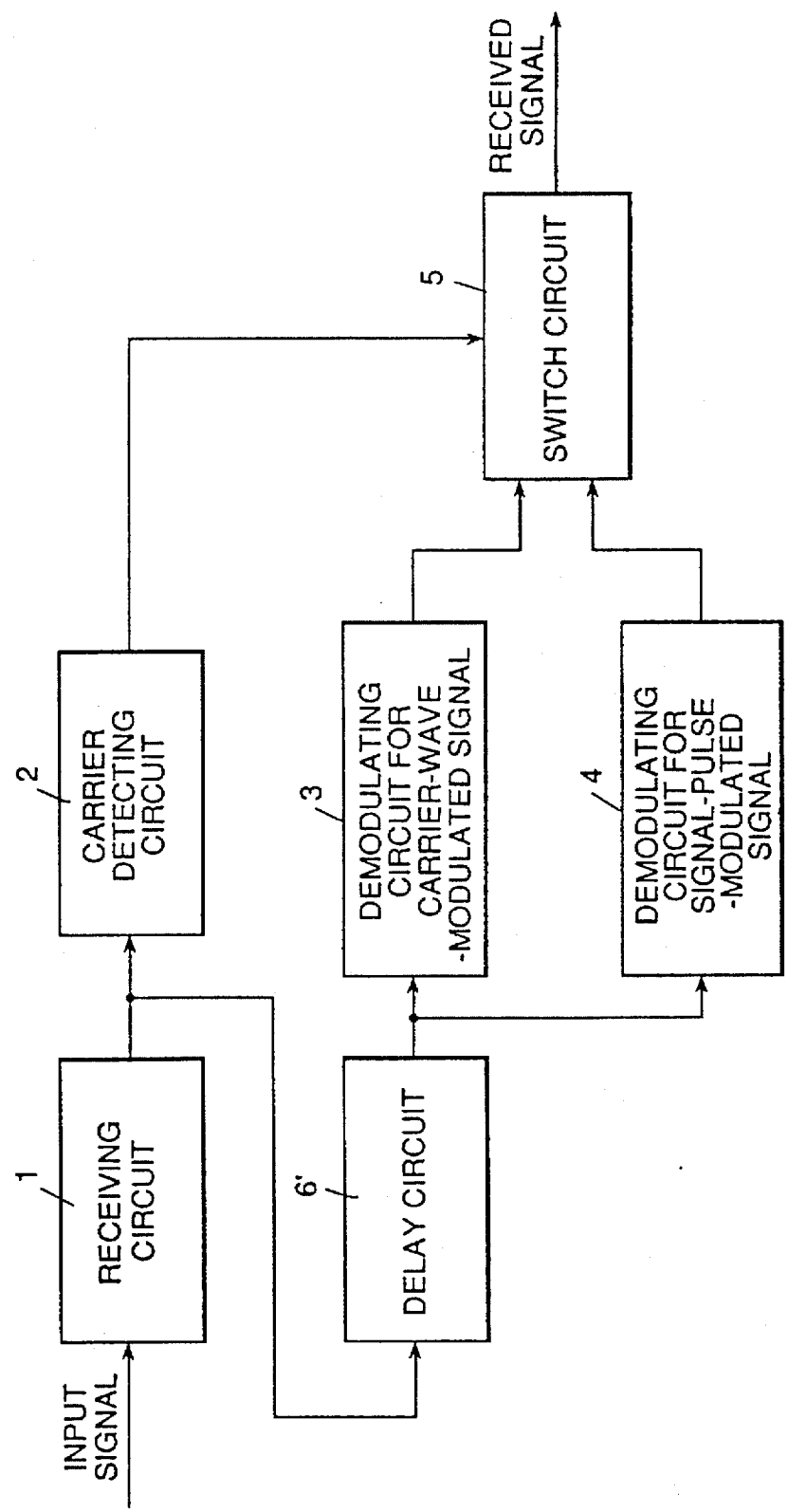
FIG. 5 is a block diagram showing a structure of a communication device that is a second embodiment of the present invention.

FIG. 5 is a block diagram showing a structure of a communication device that is a second embodiment of the present invention. Parts similar to those of the first embodiment are given like reference numerals.

In FIG. 5, numeral 1 is a receiving circuit, 2 is a carrier detecting circuit, 3 is a carrier-wave-modulated signal demodulating circuit, 4 is a single-pulse-modulated signal demodulating circuit and 5 is a switch circuit. These components are similar to those of the first embodiment.

The second embodiment features a delay circuit 6' which is interposed between the receiving circuit 1 and the demodulating circuits 3 and 4.

It requires a specified time (at least one-bit-period) until a carrier of a received signal $S_1$ or $S_2$ is discriminated and a discrimination result signal is outputted after arrival of the signal $S_1$ or $S_2$ at the carrier detecting circuit 2. As a result of this, output of the discrimination result signal is delayed. Loss of an initial part of received data may occur when the switch circuit 5 selects a demodulated serial signal output of the demodulating circuit 3 or 4 at the start of receiving signal.

Accordingly, the delay circuit 6' delays the received signal $S_1$ or $S_2$ for a time necessary for processing in the carrier detecting circuit 2 before inputting the received signal $S_1$ or $S_2$ into the demodulating circuit 3 and 4. By doing so, the switch circuit 5 can select the output of the modulating circuit 3 or 4 in time to introduce the received signal without omission of its initial part.

With the second embodiment constructed as shown in FIG. 5, a correct input signal can be obtained even if the switch 5 changes its contacts with a time lag caused by the absence of the carrier owing to that the delay circuit 6' can delay output timing of the demodulating circuits 3 and 4 for a time corresponding to the period of no carrier. Namely, the correct input signal is obtained timely with a next discrimination result signal. This eliminates the use of the delay circuit 6 of the first embodiment.

The first embodiment can reduce the user's burden by automatically selecting an output of serial signal according to the type of signal modulation but it can not prevent the leading data from being omitted due to time lag of carrier detection in the carrier detecting circuit 2.

On the contrary, the second embodiment can reduce the user's burden by automatically selecting an output of serial signal according to the type of signal modulation as well as it can prevent the leading data from being omitted even if a time lag of carrier detection in the carrier detecting circuit 2 or no carrier occurs. The second embodiment is therefore considered to be more favorable than the first embodiment.

Figure 6:
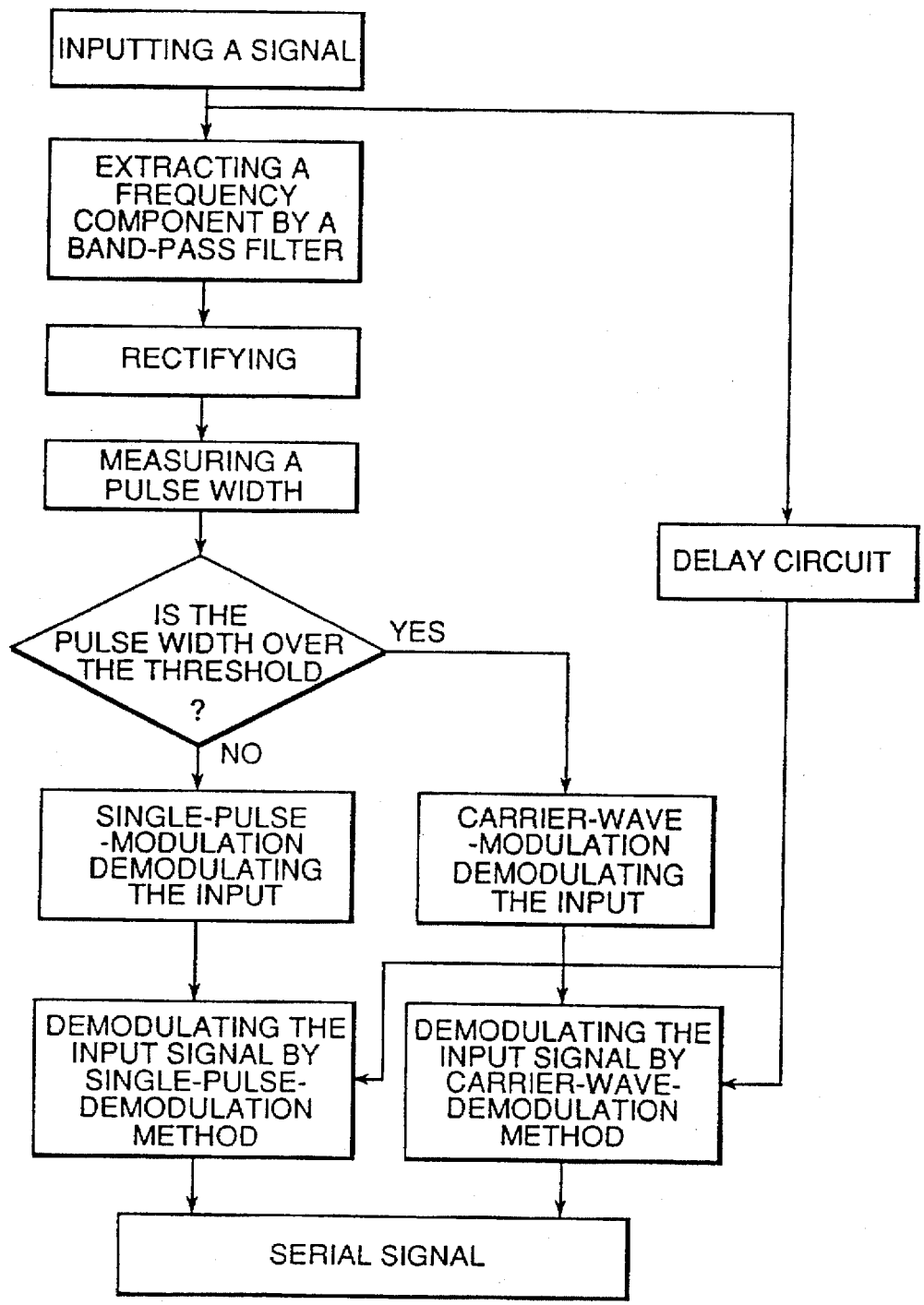
FIG. 6 is a flow chart showing a procedure of processing a received signal according to software in the second embodiment of the present invention.

Although the second embodiment is composed of the hardware shown in FIG. 5, it may also be realized by using software that is executed under control of the central processing unit as shown in a flow chart shown in FIG. 6. The detailed description of the flow chart of FIG. 6 is omitted since its procedure is in principle the same as described for the circuit operations of the embodiment shown in FIG. 5.

Figure 7:
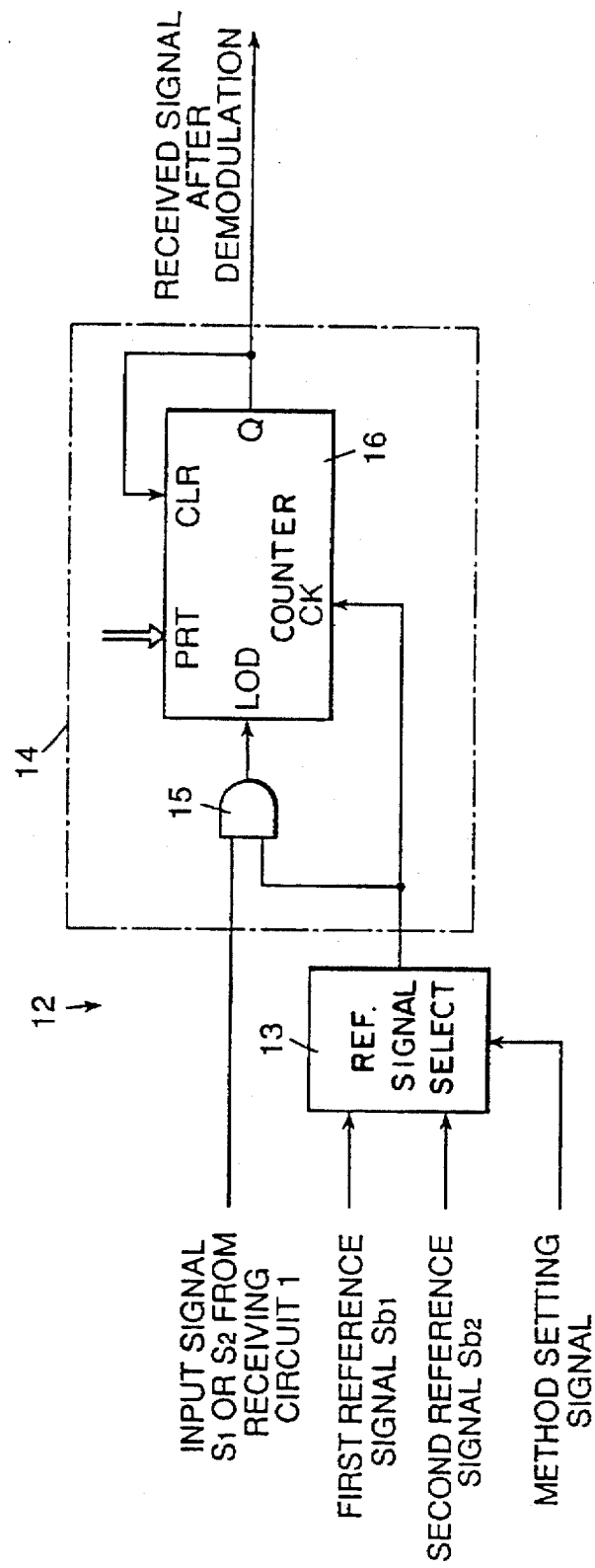
FIG. 7 is a block diagram showing a structure of a communication device that is a third embodiment of the present invention.

FIG. 7 is a block diagram showing a structure of a communication device that is a third embodiment of the present invention.

The third embodiment features a single demodulator circuit 12 for demodulating both types of transmitted signals, i.e., carrier-wave-modulated signal and single-pulse-modulated signal.

This demodulator circuit 12 includes a reference signal selecting portion 13 for selecting either a first reference signal $S_{b1}$, for demodulating a carrier-wave-modulated signal $S_1$ or a second reference signal $S_{b2}$ for demodulating a single-pulse-modulated signal $S_2$ and a signal reproducing portion 14 for reproducing an initial demodulated signal from the incoming signal $S_1$ or $S_2$ according to the first or second reference signal $S_{b1}$ or $S_{b2}$ selected by the reference signal selecting portion 14.

In the shown example, the reference signal selecting portion 13 selects either one of the reference signals $S_{b1}$ or $S_{b2}$ according to a modulation method setting signal to be preset by a user. The third embodiment however can be modified to include a carrier detecting circuit 2 and to automatically select either one of the reference signals $S_{b1}$ or $S_{b2}$ according to an output of the carrier detecting circuit 2 as the first and second embodiments do. The first reference signal $S_{b1}$ is set to have a frequency sufficiently higher than the modulated frequency of the carrier-wave-modulated signal $S_1$ and the second reference signal $S_{b2}$ is set to have a frequency slightly higher than the frequency of the single-pulse-modulated signal $S_2$ but lower than the frequency of the first reference signal $S_{b1}$).

The signal reproducing portion 14 is composed of an AND gate 15 and a counter 16.

The AND gate 15 has two inputs; at one input, it receives a carrier-wave-modulated signal $S_1$ or a single-pulse-modulated signal $S_2$ outputted by the receiving circuit (riot shown) and at the other input, it receives a reference signal $S_{b1}$ or $S_{b2}$ selected by the reference signal selecting portion 13.

The counter 16 is composed of a down-counter with three terminals: a load terminal LOD connected to the output of the AND gate 15, a clock terminal CK connected to the output of the reference signal selecting portion 13 and a clear terminal CLR connected to the output of the count output portion Q.

The operation of the demodulating circuit 12 shown in FIG. 7 will be described below with reference to timing charts shown in FIGS. 8 and 9.

Figure 8A:
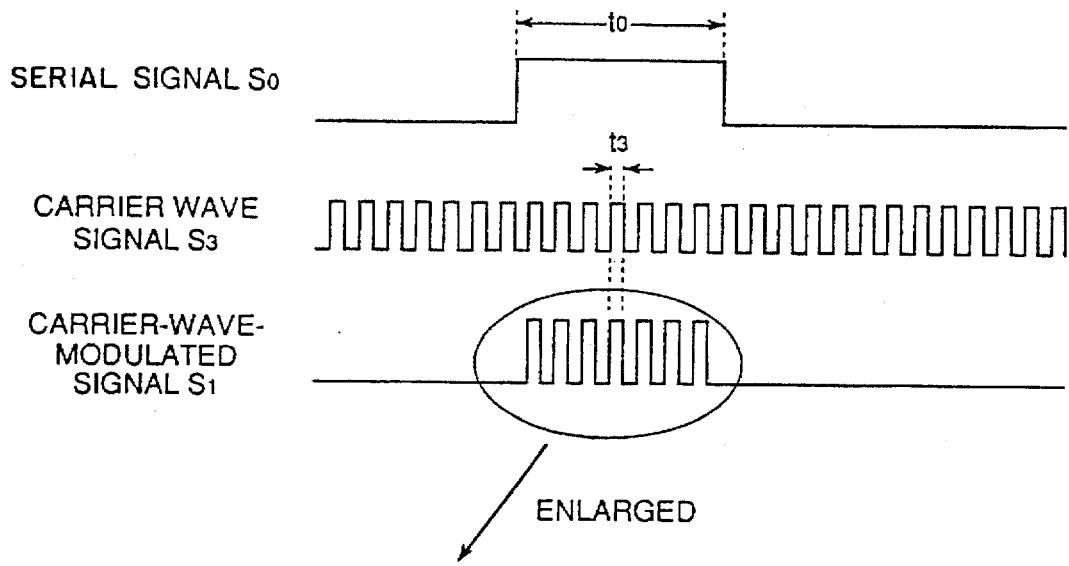
FIG. 8A is a timing chart of demodulating an input signal carrier-wave-modulated in the communication device shown in FIG. 7.
Figure 8B:
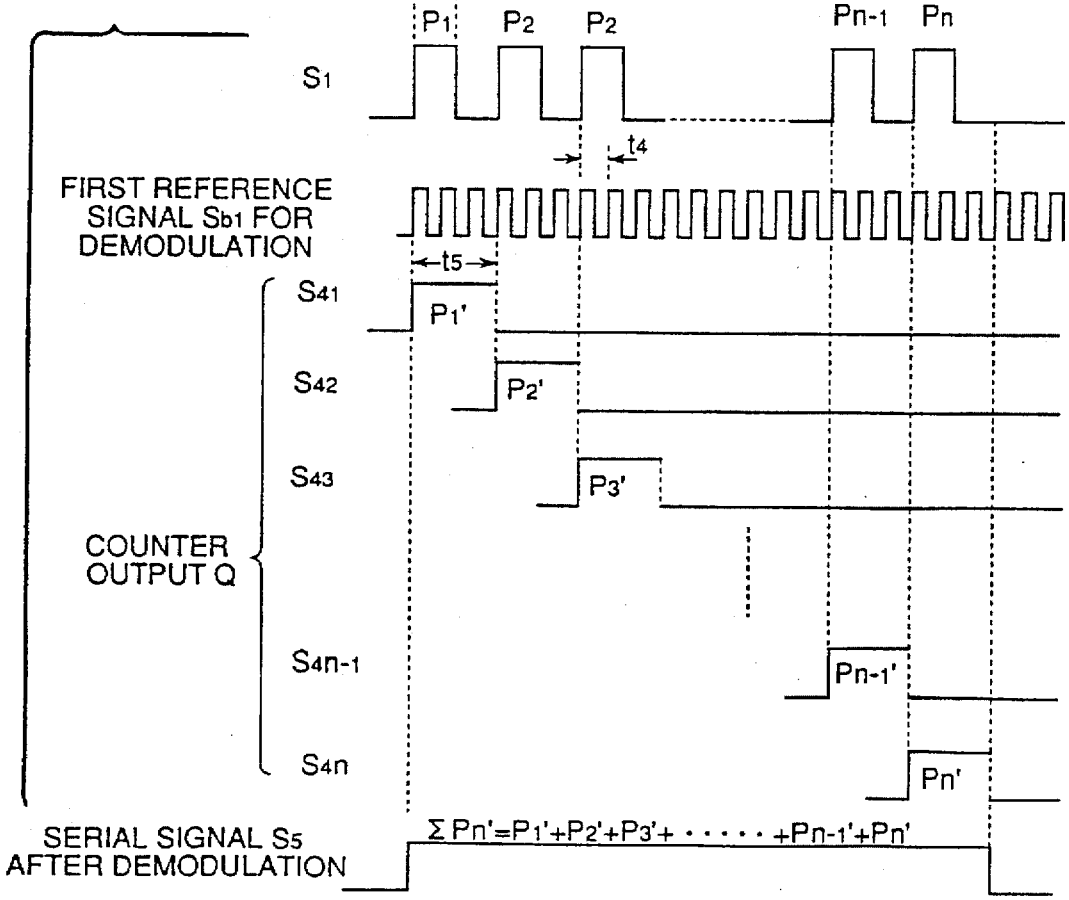
FIG. 8B shows one FIG. 8A waveform enlarged, together with other waveforms, drawn on a common time scale.

In the carrier-wave-modulation method, a serial signal $S_0$ of a pulse width $t_0$ is modulated by a carrier wave signal $S_3$ having a pulse width sufficiently smaller than the pulse width $t_0$ to a plurality of pulse-like transmission signals $S_1$ as shown in FIGS. 8A and 8B.

A carrier-wave-modulated signal $S_1$ received by the receiving circuit (not shown) is applied to one of two inputs of the AND gate 15 in the demodulating circuit 12. The reference signal selecting portion 13 has been switched by a user to select the first reference signal $S_{b1}$ which is therefore applied to the other input of the AND gate and to the counter 16.

With the carrier-wave-modulated received signal $S_1$ consisting for example of a plurality of pulse signals $P_1, P_2, \ldots P_n$, the AND gate 15 is opened by a first pulse signal $P_1$ to allow the first reference signal $S_{b1}$ to be outputted. The rising of the first reference signal $S_{b1}$ causes the counter 16 to be loaded with a preset value. The counter 16 counts down the preset value by one whenever it receives an input of the first reference signal $S_{b1}$. The output Q of the counter 16 reaches the highest level just after it has been loaded with the preset value. As soon as the preset value decreased to the predetermined value (corresponding to a position after the elapse of high-level period $t_5$ of a pulse $P_1$'), the second pulse signal $P_2$ is applied to the AND gate 15 that in turn is open and applies the first reference signal $S_{b1}$ to the counter 16. Consequently, the counter 16 is loaded again with the preset value and its output Q is maintained at the high level. This cycle is repeated until a last pulse signal $P_n$ is processed. As a result, the output Q of the counter 16 forms a wave-form signal $S_5$ that has an expression of $P_1'+O_2' \ldots +P_n'$ and that corresponds to a serial signal $S_0$ before modulation.

Figure 9:
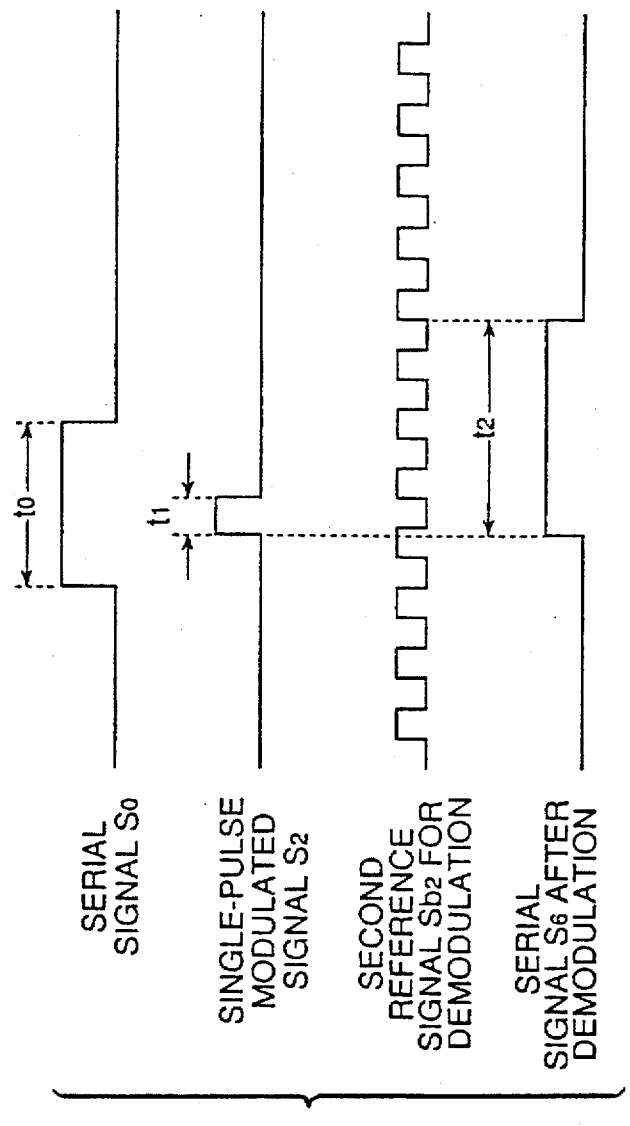
FIG. 9 is a timing chart of waveforms, drawn on a common time scale, relating to demodulating an input signal single-pulse-modulated in the communication device shown in FIG. 7.

On the other hand, the single-pulse-modulation system modulates a serial signal $S_0$ having a pulse width $t_0$ to a signal $S_2$ having a smaller pulse width $t_1$ to be transmitted as shown in FIG. 9.

The single-pulse-modulated signal $S_2$ received by the receiving circuit (not shown) is applied to one input of the AND gate 15 in the demodulating circuit 12. The reference signal selecting portion 13 has been switched by a user to select the second reference signal $S_{b2}$ which is therefore applied to the other input of the AND gate as well as to the clock terminal CK of the counter 16.

With the received single-pulse-modulated signal $S_2$ being at a high level, the AND gate 15 is opened to allow the second reference signal $S_{b2}$ to be outputted. The rising of the second reference signal $S_{b2}$ causes the counter 16 to be loaded with a preset value. The counter 16 counts down the preset value by one whenever it receives an input of the second reference signal $S_{b2}$. The output Q of the counter 16 reaches the highest level just after it has been loaded with the preset value. As soon as the preset value decreases to the predetermined value (corresponding to a position after the elapse of a period $t_2$), the output Q of the counter 16 reaches the low level. As a result of this, the output signal $S_6$ of the counter 16 corresponds to the serial signal $S_0$ before modulation.

Although the third embodiment uses the counter 16, it should not be limited thereto and may use for example a re-trigger mono/multi-circuit that outputs a pulse of a specified width according to an output of the AND gate 15.

Figure 10:
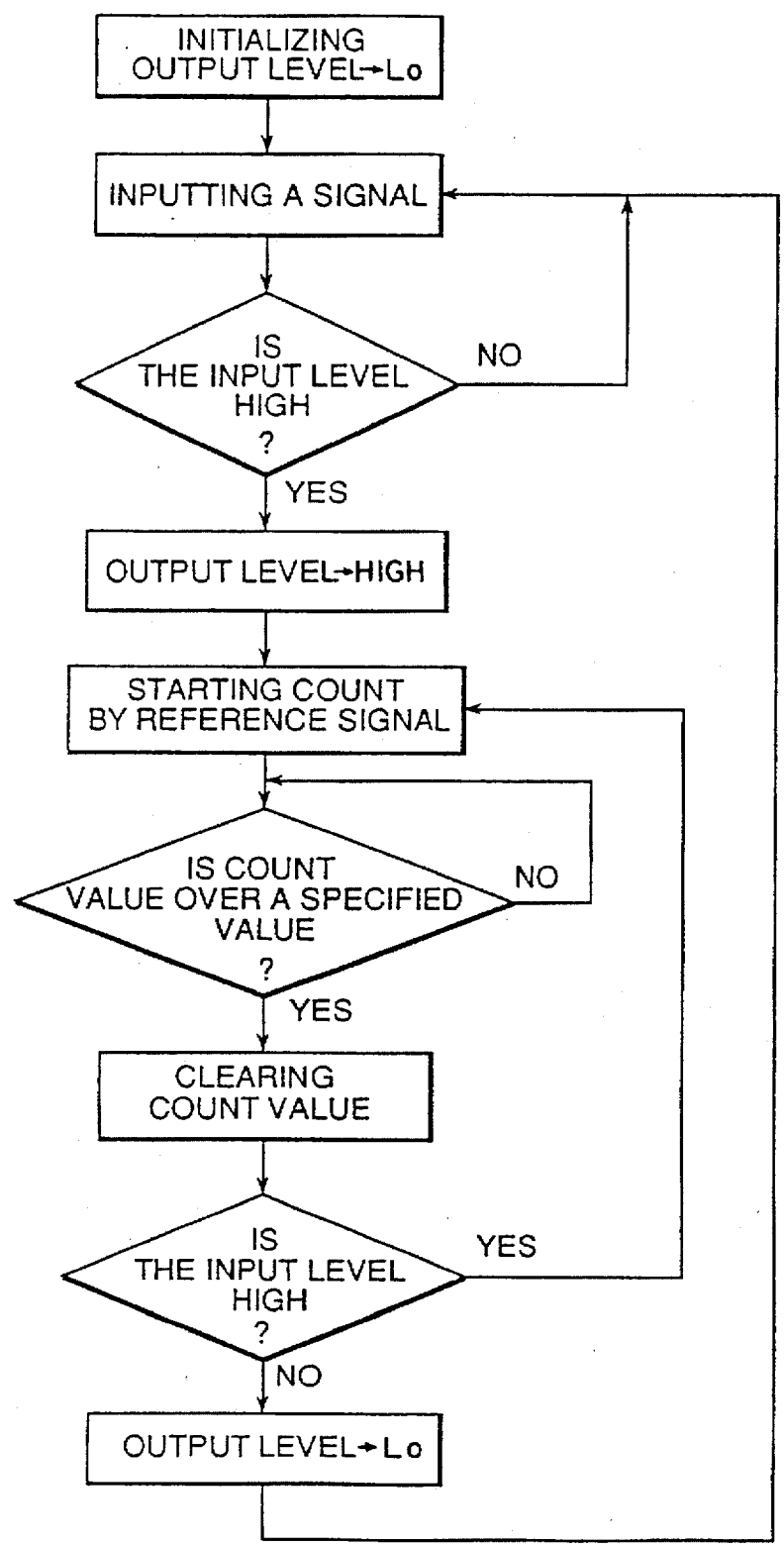
FIG. 10 is a flow chart showing a procedure of processing a received signal according to software in the third embodiment of the present invention.

In the third embodiment, the demodulating circuit 12 is composed of the hardware shown in FIG. 7. But it may also be realized by using software that is executed under control of the central processing unit as shown in a flow chart shown in FIG. 10. The detailed description of the flow chart of FIG. 10 is omitted since its procedure is in principle the same as described for the circuits of the embodiment shown in FIG. 7.

The present invention offers the following advantages:

(1) The communication device according to the present invention is easier to use since it can automatically select a correct output serial signal by discriminating that the received transmission signal is a carrier-wave-modulated signal or a single-pulse-modulated signal.

(2) The communication device according to the present invention is capable of surely demodulating a received signal without omitting a part of the received signal even if the carrier detecting circuit operates with a time lag or no carrier is present.

(3) The communication device according to the present invention uses a single demodulating circuit (the conventional device needs two separate demodulators). This makes it possible to reduce the circuitry and reduce the power consumption of the device.

I claim:

1. A communication device comprising a demodulating circuit for demodulating a signal transmitted as a carrier-wave-modulated signal, a demodulating circuit for demodulating a signal transmitted as a single-pulse-modulated signal, and a switch circuit for selecting either one of the two demodulating circuits, wherein a carrier detecting circuit is further provided for detecting presence or absence of a carrier-frequency component of the carrier-wave-modulated signal and the switch circuit is designed to select an output of the demodulating circuit for the carrier-wave-modulated signal instead of an output of the demodulating circuit for the single-pulse-modulated signal when the carrier of the carrier-wave-modulated signal is detected by the carrier detecting circuit.

2. A communication device according to claim 1, wherein a delay circuit, for delaying an input signal for a time necessary for carrier detection processing by the carrier detecting circuit, is disposed at a front stage of each of the demodulating circuits.

3. A communication device comprising a single demodulating circuit for receiving and demodulating both a carrier-wave-modulated signal and a single-pulse modulated signal, said circuit being provided with a reference signal selecting portion for selecting either a first reference signal for demodulating the carrier-wave-modulated signal or a second reference signal for demodulating the single-pulse-modulated signal, and a signal reproducing portion for reproducing from a received transmission signal and from the first reference signal or the second reference signal selected by the reference signal selecting portion, a signal corresponding to a serial signal before modulation.

* * * * *